(12) United States Patent
Kim et al.

(10) Patent No.: US 11,672,158 B2
(45) Date of Patent: Jun. 6, 2023

(54) DISPLAY DEVICE AND MANUFACTURING METHOD THEREOF

(71) Applicant: SAMSUNG DISPLAY CO., LTD., Yongin-si (KR)

(72) Inventors: Hwa-Jeong Kim, Hwaseong-si (KR); Young Kuk Kim, Seoul (KR)

(73) Assignee: SAMSUNG DISPLAY CO., LTD.

( * ) Notice: Subject to any disclaimer, the term of this patent is extended or adjusted under 35 U.S.C. 154(b) by 379 days.

(21) Appl. No.: 16/738,060

(22) Filed: Jan. 9, 2020

(65) Prior Publication Data
US 2020/0312923 A1 Oct. 1, 2020

(30) Foreign Application Priority Data

Apr. 1, 2019 (KR) .......... 10-2019-0037996

(51) Int. Cl.
H01L 27/32 (2006.01)
H01L 51/00 (2006.01)
(Continued)

(52) U.S. Cl.
CPC ........ *H01L 27/3223* (2013.01); *H01L 27/323* (2013.01); *H01L 27/3258* (2013.01);
(Continued)

(58) Field of Classification Search
CPC . H01L 27/3276; H01L 27/3223; H01L 51/50; H01L 51/56; H01L 27/32; H01L 27/3241; H01L 27/3244; H01L 27/3258; H01L 27/326; H01L 27/3262; H01L 27/3265; H01L 2227/323; H01L 27/124; H01L 51/0097; H01L 51/5281
See application file for complete search history.

(56) References Cited

U.S. PATENT DOCUMENTS 5,291,375 A * 3/1994 Mukai ................ H05K 3/3426
361/767
5,659,202 A * 8/1997 Ashida ................ H01L 23/528
257/E23.021
(Continued)

FOREIGN PATENT DOCUMENTS

JP WO9812568 3/1998
JP 4768343 9/2011
(Continued)

*Primary Examiner* — Maliheh Malek
(74) *Attorney, Agent, or Firm* — F. Chau & Associates, LLC

(57) ABSTRACT

An embodiment of the present invention provides a display device including: a substrate including a display area in which an image is displayed and a non-display area disposed outside the display area; a pad portion disposed in the non-display area on the substrate and including a plurality of pads spaced apart by a predetermined distance; and a flexible printed circuit board bonded to the pad portion, wherein the flexible printed circuit board may include a plurality of leads, each of the plurality of pads may be bonded to each of the plurality of leads, each of the plurality of pads may include a contact pad electrode that contacts each of the plurality of leads, and the contact pad electrode may include a dummy electrode surrounding an edge of a lower surface of each of the plurality of leads.

13 Claims, 16 Drawing Sheets

(51) Int. Cl.
    *H01L 51/52*      (2006.01)
    *H01L 51/56*      (2006.01)
    *H01L 51/50*          (2006.01)

(52) U.S. Cl.
    CPC ...... *H01L 27/3262* (2013.01); *H01L 27/3265*
        (2013.01); *H01L 27/3276* (2013.01); *H01L*
        *51/0031* (2013.01); *H01L 51/5253* (2013.01);
        *H01L 51/56* (2013.01); *H01L 2227/323*
        (2013.01); *H01L 2251/558* (2013.01)

(56) References Cited

U.S. PATENT DOCUMENTS

| | | | | |
|---|---|---|---|---|
| 7,102,223 B1* | 9/2006 | Kanaoka | ........... | H01L 21/76202 |
| | | | | 257/781 |
| 10,804,348 B2* | 10/2020 | Kim | ............ | H01L 51/5253 |
| 11,264,596 B2* | 3/2022 | Lee | ............ | H01L 27/3244 |
| 2002/0044251 A1* | 4/2002 | Togashi | ............ | G02F 1/13452 |
| | | | | 349/149 |
| 2011/0115093 A1* | 5/2011 | Park | ............ | H01L 21/76816 |
| | | | | 257/773 |
| 2011/0186844 A1* | 8/2011 | Koo | ............ | H01L 29/786 |
| | | | | 438/34 |
| 2012/0146085 A1* | 6/2012 | Park | ............ | H01L 27/124 |
| | | | | 438/22 |
| 2014/0062909 A1* | 3/2014 | Choi | ............ | G09G 3/32 |
| | | | | 345/173 |
| 2015/0255740 A1* | 9/2015 | Nakada | ............ | H01L 51/5237 |
| | | | | 257/40 |
| 2015/0346869 A1* | 12/2015 | Jang | ............ | G06F 3/04184 |
| | | | | 345/174 |
| 2015/0355751 A1* | 12/2015 | Kurasawa | ............ | G06F 3/0445 |
| | | | | 345/174 |
| 2017/0176803 A1* | 6/2017 | Sonoda | ............ | G02F 1/13306 |
| 2017/0205928 A1* | 7/2017 | Noguchi | ............ | H05K 1/147 |
| 2017/0271421 A1* | 9/2017 | Jinbo | ............ | H01L 27/3258 |
| 2017/0364194 A1* | 12/2017 | Jang | ............ | H01L 27/323 |
| 2018/0026051 A1* | 1/2018 | Dong | ............ | H01L 27/3223 |
| | | | | 348/450 |
| 2018/0039360 A1* | 2/2018 | Akimoto | ............ | G06F 3/0446 |
| 2018/0040672 A1* | 2/2018 | Park | ............ | G06F 1/1652 |
| 2018/0061869 A1* | 3/2018 | Suzuki | ............ | G02F 1/134309 |
| 2018/0062092 A1* | 3/2018 | Jeong | ............ | H01L 51/0097 |
| 2018/0190723 A1* | 7/2018 | Han | ............ | G06F 3/0446 |
| 2018/0269269 A1* | 9/2018 | Kim | ............ | H01L 51/0097 |
| 2018/0321539 A1* | 11/2018 | Koide | ............ | G06F 3/04164 |
| 2019/0181205 A1* | 6/2019 | Kim | ............ | H01L 27/3258 |
| 2019/0214596 A1* | 7/2019 | Park | ............ | H01L 27/3276 |
| 2019/0267438 A1* | 8/2019 | Goto | ............ | H01L 27/3223 |
| 2020/0051940 A1* | 2/2020 | Kim | ............ | G02F 1/13454 |
| 2020/0066818 A1* | 2/2020 | Akagawa | ............ | H01L 51/5265 |
| 2020/0075612 A1* | 3/2020 | Sogawa | ............ | H01L 21/82385 |
| 2020/0089369 A1* | 3/2020 | Bang | ............ | G06F 3/0416 |
| 2020/0211477 A1* | 7/2020 | Lai | ............ | G09G 3/3266 |
| 2020/0212115 A1* | 7/2020 | Choi | ............ | H01L 51/5281 |
| 2020/0273919 A1* | 8/2020 | Ding | ............ | G06F 3/0448 |
| 2020/0312923 A1* | 10/2020 | Kim | ............ | H01L 27/3258 |
| 2020/0355972 A1* | 11/2020 | Jian | ............ | G02F 1/13452 |
| 2021/0066400 A1* | 3/2021 | Dong | ............ | H01L 51/56 |
| 2021/0066421 A1* | 3/2021 | Son | ............ | H01L 27/1225 |
| 2021/0109616 A1* | 4/2021 | Park | ............ | G06F 3/0416 |
| 2021/0175304 A1* | 6/2021 | Lee | ............ | H01L 27/3223 |
| 2021/0242284 A1* | 8/2021 | Kim | ............ | G06F 3/0443 |
| 2021/0265446 A1* | 8/2021 | Kim | ............ | H01L 24/08 |
| 2021/0320163 A1* | 10/2021 | Bang | ............ | H01L 27/3276 |
| 2021/0351262 A1* | 11/2021 | Kim | ............ | H01L 27/3223 |
| 2021/0399262 A1* | 12/2021 | Woo | ............ | H01L 51/5281 |
| 2021/0408134 A1* | 12/2021 | Li | ............ | H01L 51/56 |
| 2022/0093677 A1* | 3/2022 | Jeong | ............ | G09F 9/33 |
| 2022/0093694 A1* | 3/2022 | Park | ............ | G06F 3/04166 |
| 2022/0100303 A1* | 3/2022 | Lee | ............ | G06F 3/0446 |
| 2022/0246706 A1* | 8/2022 | Choi | ............ | H01L 27/3276 |
| 2022/0250285 A1* | 8/2022 | Maeyama | ............ | D21H 27/002 |
| 2022/0279654 A1* | 9/2022 | Oh | ............ | G02F 1/13458 |
| 2023/0005966 A1* | 1/2023 | Seo | ............ | H01L 27/3262 |

FOREIGN PATENT DOCUMENTS

| | | |
|---|---|---|
| JP | 5134582 | 1/2013 |
| JP | 6161251 | 7/2017 |
| KR | 10-0531393 | 11/2005 |
| KR | 10-0734250 | 6/2007 |
| KR | 10-2018-0000046 | 1/2018 |

* cited by examiner

DISPLAY DEVICE AND MANUFACTURING METHOD THEREOF

CROSS-REFERENCE TO RELATED APPLICATION

This application claims priority under 35 U.S.C. 119 to Korean Patent Application No. 10-2019-0037996 filed in the Korean Intellectual Property Office on Apr. 1, 2019, the disclosure of which is incorporated by reference herein in its entirety.

BACKGROUND

(a) Field

The present disclosure relates to a display device and a manufacturing method thereof.

(b) Description of the Related Art

Display devices include a substrate and a plurality of signal lines and transistors disposed on the substrate. In addition, a flexible printed circuit film that applies various signals for driving the display devices may be bonded to a pad of the substrate.

An anisotropic conductive film (ACF) is used for bonding the flexible printed circuit film. The anisotropic conductive film is a film in which conductive particles are arranged in an insulating layer such as a resin film, and it is conductive in a thickness direction thereof, and is insulating in a surface direction thereof. In this case, a lead and a pad of the flexible printed circuit film are bonded by the conductive particles, and a substantial bonding area of the pad and the lead is smaller than areas of the pad and the lead.

The above information disclosed in this Background section is only for enhancement of understanding of the background of the invention, and therefore it may contain information that does not form the prior art that is already known in this country to a person of ordinary skill in the art.

SUMMARY

The present invention has been made in an effort to provide a display device and a manufacturing method thereof that may perform an ultrasonic bonding process to bond a flexible printed circuit film and a substrate.

According to an exemplary embodiment of the present invention, a display device includes a substrate including a display area including a pad portion with a plurality of pads spaced apart from each other by a predetermined distance and a flexible printed circuit board with a plurality of leads. Each of the plurality of pads is bonded to a corresponding lead of the plurality of leads, each of the plurality of pads includes a contact pad electrode that contacts a lower surface of a corresponding lead of the plurality of leads and a dummy electrode surrounding an edge of the lower surface of the corresponding lead of the plurality of leads.

The contact pad electrode includes the same material as the plurality of leads.

The lower surface of each of the plurality of leads is uneven.

Each of the plurality of pads includes an inspection part configured to inspect the lower surface of a corresponding lead of the plurality of leads, and an opening of the contact pad electrode corresponds to the inspection part.

Each of the plurality of pads extends in a direction perpendicular to an edge portion of the substrate on which the flexible printed circuit board is connected to the pad portion.

The display device further includes a semiconductor layer disposed on the substrate, a gate insulating layer disposed on the semiconductor layer, a gate electrode and a first capacitor electrode disposed on the gate insulating layer and spaced apart from each other, a capacitor insulating layer disposed on the gate electrode and the first capacitor electrode, a second capacitor electrode disposed on the capacitor insulating layer and overlapping the first capacitor electrode, an interlayer insulating layer disposed on the capacitor insulating layer and the second capacitor electrode, a source electrode and a drain electrode disposed on the interlayer insulating layer and spaced apart from each other, a planarization film disposed on the source electrode and the drain electrode, and a light emitting diode disposed on the planarization film and connected to the drain electrode.

The display device further includes a cutout surrounding each of the plurality of pads. The cutout penetrates the interlayer insulating layer and the capacitor insulating layer.

The planarization film covers the cut portion and cover a lateral surface of the contact pad electrode.

Each of the plurality of pads further includes a gate pad electrode disposed between the substrate and the contact pad electrode.

The display device further includes a plurality of pad contact holes penetrating the interlayer insulating layer and the capacitor insulating layer to expose the gate pad electrode and spaced apart from each other in a direction in which the pad portion extends. The capacitor insulating layer and the interlayer insulating layer are disposed between the gate pad electrode and the contact pad electrode. The contact pad electrode contacts the gate pad electrode through the plurality of pad contact holes.

Each of the plurality of pads further includes a capacitor pad electrode between the gate pad electrode and the contact pad electrode, the gate pad electrode includes the same material as the gate electrode, the capacitor pad electrode includes the same material as the second capacitor electrode, and the contact pad electrode further includes the same material as the source electrode and the drain electrode.

The display device further includes a plurality of pad contact holes penetrating the interlayer insulating layer to expose the capacitor pad electrode and spaced apart from each other in a direction in which the pad portion extends. The capacitor insulating layer is disposed between the gate pad electrode and the capacitor pad electrode. The interlayer insulating layer is disposed between the capacitor pad electrode and the contact pad electrode. The contact pad electrode contacts the capacitor pad electrode through the plurality of pad contact holes.

The plurality of pads include first and second pads adjacent to each other, the first pad further includes a gate pad electrode disposed between the substrate and the contact pad electrode, and the second pad further includes a capacitor pad electrode disposed between the substrate and the contact pad electrode.

The contact pad electrode further includes protrusions disposed on left, right, and lower sides of the contact pad electrode in a plan view.

According to an exemplary embodiment of the present invention, a manufacturing method of a display device is provided as follows. A plurality of pixels and a plurality of spare pads are formed on a substrate. Each of the plurality of spare pads includes a data pad electrode. A flexible printed circuit board including a plurality of leads is aligned to the plurality of spare pads so that the data pad electrode is associated with a corresponding lead of the plurality of leads. Ultrasonic vibration is applied to form a plurality of contact pad electrodes from the data pad electrode and the corresponding lead associated with each other. Each of the contact pad electrodes is in contact with a corresponding lead of the plurality of leads. The contact pad electrodes include a material included in the data pad electrode and a material included in the plurality of leads. Each of the plurality of spare pads extends in a first direction perpendicular to an edge portion of the substrate to which the flexible printed circuit board is bonded. The applying of the ultrasonic vibration is performed in the first direction.

The applying of the ultrasonic vibration further forms a dummy electrode surrounding an edge of a lower surface of each of the plurality of leads.

The lower surface of each of the plurality of leads contacting a corresponding one of the plurality of contact pad electrodes is uneven.

The manufacturing method of the display device further includes performing an inspection on the lower surface of each of the plurality of leads through an opening of each of the plurality of contact pad electrodes.

The data pad electrode and a corresponding contact pad electrode are formed on an interlayer insulating layer, and the data pad electrode includes a step.

A thickness of the data pad electrode formed on the interlayer insulating layer is thicker than a thickness of the corresponding contact pad electrode formed on the interlayer insulating layer.

According to the embodiments, a bonding area between a flexible printed circuit film and a substrate may increase by performing an ultrasonic bonding process to bond the flexible printed circuit film and the substrate.

DETAILED DESCRIPTION OF THE EMBODIMENTS

Figure 1:
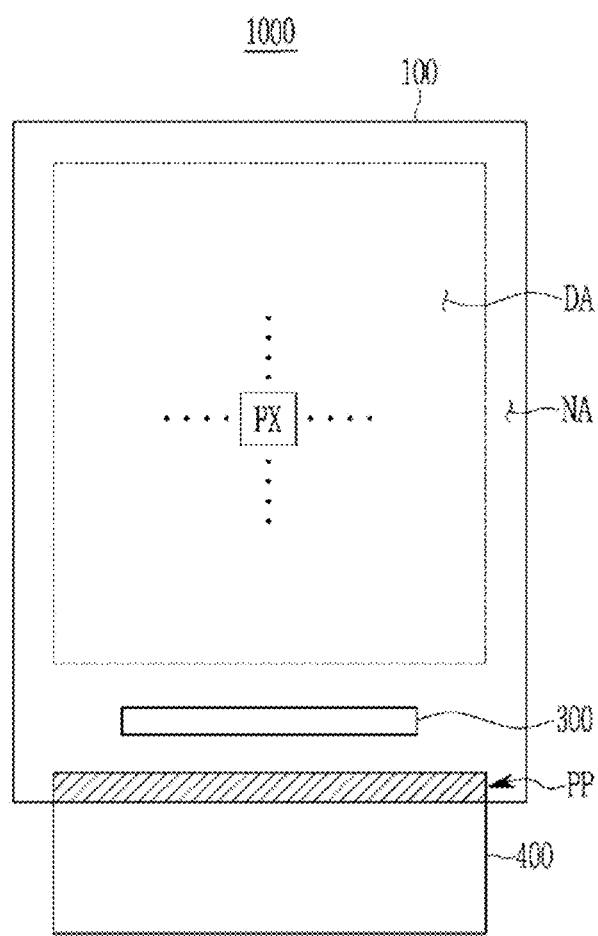
FIG. 1 schematically illustrates a display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

To clearly describe the present invention, portions which do not relate to the description are omitted, and like reference numerals designate like elements throughout the specification.

Further, in the drawings, the size and thickness of each element are arbitrarily illustrated for ease of description, and the present invention is not necessarily limited to those illustrated in the drawings. In the drawings, the thicknesses of layers, films, panels, regions, etc., are exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

A display device according to an exemplary embodiment of the present invention will now be described with reference to FIG. 1.

FIG. 1 schematically illustrates a display device according to an exemplary embodiment of the present invention.

Referring to FIG. 1, a display device 1000 according to the present embodiment includes a substrate 100 including a display area DA and a non-display area NA disposed around the display area DA.

The substrate 100 may include glass or plastic. In addition, the substrate 100 may be a flexible substrate including a material that is excellent in heat resistance and durability, such as polyethylene naphthalate (PEN), polycarbonate (PC), polyarylate (PAR), polyether imide (PEI), polyether sulfone (PES), and polyimide (PI). However, the present invention is not limited thereto, and the substrate 100 may include a flexible substrate made of various flexible materials.

Elements for displaying an image are disposed in the display area DA to display the image. The non-display area NA does not display an image, and the non-display area NA includes elements and/or wires for generating and/or transmitting various signals to be applied to the display area DA. In FIG. 1, four edge areas including left and right edge areas and upper and lower edge areas are shown as the non-display area NA. The present invention is not limited thereto. In an exemplary embodiment, only an edge area of one side of the substrate 100, that is, only a lower edge area of the substrate 100, may serve as the non-display area NA. Although the display area DA is shown as a quadrangle, the display area DA may have various shapes such as circular, elliptical, and polygonal in addition to quadrangular.

A plurality of pixels PX are disposed, for example, in a matrix form, in the display area DA of the substrate 100. Signal lines such as a plurality of gate lines (not shown), a plurality of data lines (not shown), and a plurality of driving voltage lines (not shown) are disposed in the display area DA. The gate lines may substantially extend in a row direction, and the data lines may substantially extend in a column direction crossing the row direction. In addition, the driving voltage lines may substantially extend in the column direction. Each pixel PX is connected to a corresponding gate line and a corresponding data line to receive a gate signal and a data signal from these signal lines. In addition, each pixel PX may be connected to a corresponding driving voltage line to receive a driving voltage.

A driving part 300 for generating and/or processing various signals for driving the display device and a pad portion PP including pads for receiving signals from the outside are disposed in the non-display area NA of the substrate 100.

The driving part 300 may include a data driving part for applying the data signal to the data line, a gate driving part for applying the gate signal to the gate line, and a signal control part for controlling the data driving part and the gate driving part. The driving part 300 may be mounted as a chip between the display area DA and the pad portion PP. In this case, the driving part 300 may include the data driving part and the signal control part, and the gate driving part may be integrated in the non-display area NA of left/right edges of the substrate 100.

A flexible printed circuit film 400 includes a first end that is bonded to the pad portion PP and a second end that is connected to, for example, an external printed circuit board to receive signals such as image data, and to receive a power supply voltage such as a driving voltage ELVDD and a common voltage. In an exemplary embodiment, the first end and the second end may be opposite to each other.

A structure of the pixel of the display device shown in FIG. 1 will now be described with reference to FIG. 2.

Several layers, lines, and elements are provided on the substrate 100. Although a large number of pixels are arranged in the display area DA of the substrate 100, only one pixel is shown in FIG. 2 in order to simplify the drawing. Each pixel includes a plurality of transistors, but one transistor will be mainly described for the convenience of description.

Figure 2:
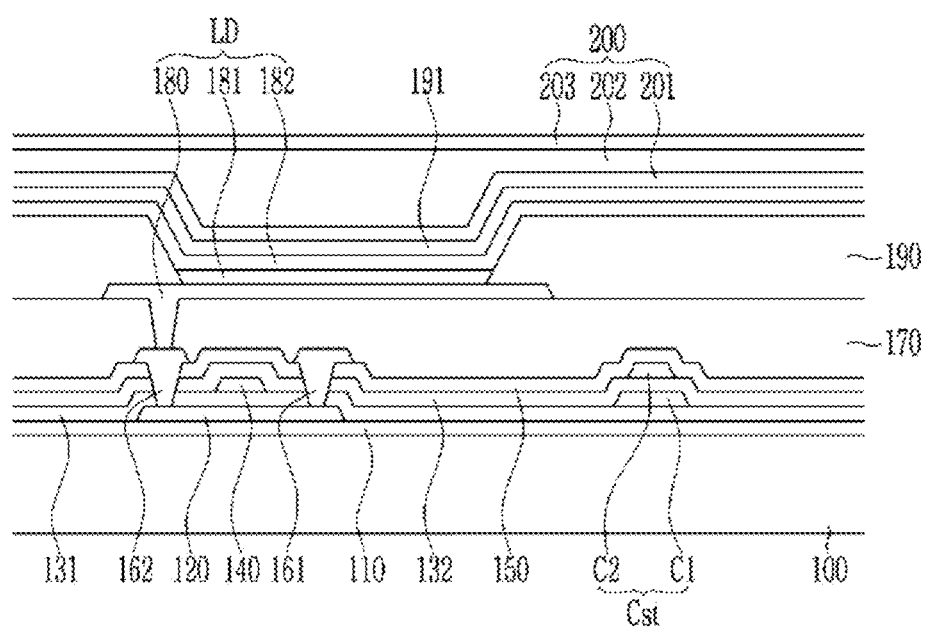
FIG. 2 schematically illustrates a cross-sectional view of one pixel of the display device shown in FIG. 1 according to an exemplary embodiment of the present invention.

FIG. 2 schematically illustrates a cross-sectional view of one pixel of the display device shown in FIG. 1.

Referring to FIG. 2, a buffer layer 110 is disposed on the substrate 100. The buffer layer 110 may be formed of a single layer of a silicon nitride (SiNx) or a double layer in which a silicon nitride (SiNx) and a silicon oxide (SiOx) are stacked. The buffer layer 110 serves to prevent unnecessary components such as impurities or moisture from penetrating, and at the same time, to flatten a surface. The buffer layer 110 may be omitted depending on a type of the substrate 100 and a process condition.

A semiconductor layer 120 is disposed on the buffer layer 110. The semiconductor layer 120 may include a source region and a drain region that are doped with impurities, and a channel region disposed therebetween. The semiconductor layer 120 may include polycrystalline silicon or an oxide semiconductor.

A gate insulating layer 131 is disposed on the semiconductor layer 120 and the buffer layer 110, and a gate electrode 140 and a first capacitor electrode C1, which are spaced apart from each other, are disposed on the gate insulating layer 131. The gate electrode 140 and the first capacitor electrode C1 may include the same material. The gate electrode 140 overlaps the semiconductor layer 120. In this case, the gate electrode 140 overlaps the channel region of the semiconductor layer 120.

A capacitor insulating layer 132 is disposed on the gate electrode 140, the first capacitor electrode C1, and the gate insulating layer 131. The gate insulating layer 131 and the capacitor insulating layer 132 may include an inorganic insulating material such as a silicon nitride and a silicon oxide. In an exemplary embodiment, the gate insulating layer 131 and the capacitor insulating layer 132 may include different inorganic insulating materials. For example, the gate insulating layer 131 and the capacitor insulating layer 132 may include a silicon nitride and a silicon oxide, respectively. The present invention is not limited thereto. For example, the gate insulating layer 131 and the capacitor insulating layer 132 may include the same inorganic insulating material.

A second capacitor electrode C2 is disposed on the capacitor insulating layer 132. The second capacitor electrode C2 overlaps the first capacitor electrode C1, and forms a storage capacitor Cst with the capacitor insulating layer 132 disposed between the second capacitor electrode C2 and the first capacitor electrode C1 as a dielectric.

An interlayer insulating layer 150 is disposed on the second capacitor electrode C2 and the capacitor insulating layer 132. The interlayer insulating layer 150 may include an inorganic insulating material such as a silicon nitride and a silicon oxide.

A source electrode 161 and a drain electrode 162 that are spaced apart from each other are disposed on the interlayer insulating layer 150. The source electrode 161 and the drain electrode 162 are connected to the semiconductor layer 120 through contact holes disposed in the gate insulating layer 131, the capacitor insulating layer 132, and the interlayer insulating layer 150. Here, a portion of the semiconductor layer 120 connected to the source electrode 161 and a portion of the semiconductor layer 120 connected to the drain electrode 162 are the source region and the drain region, respectively. The source electrode 161 and the drain electrode 162 may be a single film or a multiple film including titanium (Ti), aluminum (Al), or silver (Ag). For example, the source electrode 161 and the drain electrode 162 may have a triple-film structure of titanium (Ti)/aluminum (Al)/titanium (Ti).

The gate electrode 140, the source electrode 161, and the drain electrode 162 form a transistor together with the semiconductor layer 120, and a channel of the transistor is formed in the channel region of the semiconductor layer 120 overlapping the gate electrode 140. The transistor as shown in FIG. 2 may be a driving transistor in a pixel of a display device. The transistor may be a top-gate transistor because the gate electrode 140 is disposed above the semiconductor layer 120. The structure of the transistor is not limited thereto, and may be variously changed, and for example, the transistor may be a bottom-gate transistor in which the gate electrode is disposed under the semiconductor.

A planarization film 170 is disposed on the source electrode 161, the drain electrode 162, and the interlayer insulating layer 150. The planarization film 170 may include an organic material, and an upper surface thereof may be planarized.

A light emitting diode LD and a pixel defining layer 190 are disposed on the planarization film 170. The light emitting diode LD emits light in accordance with a signal received from the transistor. The light emitting diode LD includes a first electrode 180, a light emitting member 181, and a second electrode 182.

The first electrode 180 is disposed on the planarization film 170, and is electrically connected to the drain electrode 162 through a contact hole formed in the planarization film 170. The first electrode 180 serves as an anode of the light emitting diode LD.

The first electrode 180 may include a reflective material, and may include at least one of magnesium (Mg), silver (Ag), gold (Au), calcium (Ca), lithium (Li), chromium (Cr), aluminum (Al), and an alloy thereof.

The pixel defining layer 190 is disposed on the planarization film 170, and is provided with an opening overlapping the first electrode 180. The pixel defining layer 190 may include an organic material.

The light emitting member 181 is disposed on the first electrode 180 overlapping the opening of the pixel defining layer 190. For example, the light emitting member 181 is disposed within the opening of the pixel defining layer 190. The light emitting member 181 may include at least one of a light emitting layer, a hole-injection layer (HIL), a hole-transporting layer (HTL), an electron-transporting layer (ETL), and an electron-injection layer (EIL). When the light emitting member includes all of them, the hole-injection layer is disposed on the first electrode 180, which is an anode, and the hole-transporting layer, the light emitting layer, the electron-transporting layer, and the electron-injection layer may be sequentially stacked thereon. Here, the light emitting layer may include an organic material or may include an inorganic material.

The second electrode 182 is disposed on the pixel defining layer 190 and the light emitting member 181. The second electrode 182 may include a transparent material. The second electrode 182 may include an indium tin oxide (In—Sn—O, ITO), an indium gallium oxide (In—Ga—O, IGO), or an indium zinc oxide (In—Zn—O, IZO). In addition, the second electrode 182 may include a thin silver-magnesium alloy, a thin silver-lithium alloy, silver (Ag), magnesium (Mg), or calcium (Ca). The second electrode 182 serves as a cathode of the light emitting diode LD.

A capping layer 191 is disposed on the second electrode 182. The capping layer 191 allows light generated from the light emitting member 181 to be efficiently emitted toward the outside.

An encapsulation layer 200 is disposed on the capping layer 191. The encapsulation layer 200 may encapsulate the light emitting diode LD to prevent moisture or oxygen from penetrating from the outside. The encapsulation layer 200 includes a first inorganic layer 201, an organic layer 202, and a second inorganic layer 203. The first inorganic layer 201 is disposed on the capping layer 191, and may include an inorganic material. The organic layer 202 is disposed on the first inorganic layer 201, and may include an organic material. In addition, an upper surface of the organic layer 202 may be planarized. The second inorganic layer 203 is disposed on the organic layer 202, and may include an inorganic material. In addition, the encapsulation layer 200 may further include at least one organic layer and at least one inorganic layer sequentially disposed on the second inorganic layer 203. In this case, the organic layer and the inorganic layer may be alternately disposed.

A touch sensing layer may be disposed on the encapsulation layer 200. The touch sensing layer may sense a touch when an object approaches the touch sensing layer or actually touches the touch sensing layer. Here, the touch includes not only when an external object such as a user's finger directly touches the touch sensing layer, but also when the external object approaches the touch sensing layer or hovers in a state in which the external object approaches the touch sensing layer.

Hereinafter, the pad portion of the display device shown in FIG. 1 will be described with reference to FIG. 3 to FIG. 5.

Figure 3:
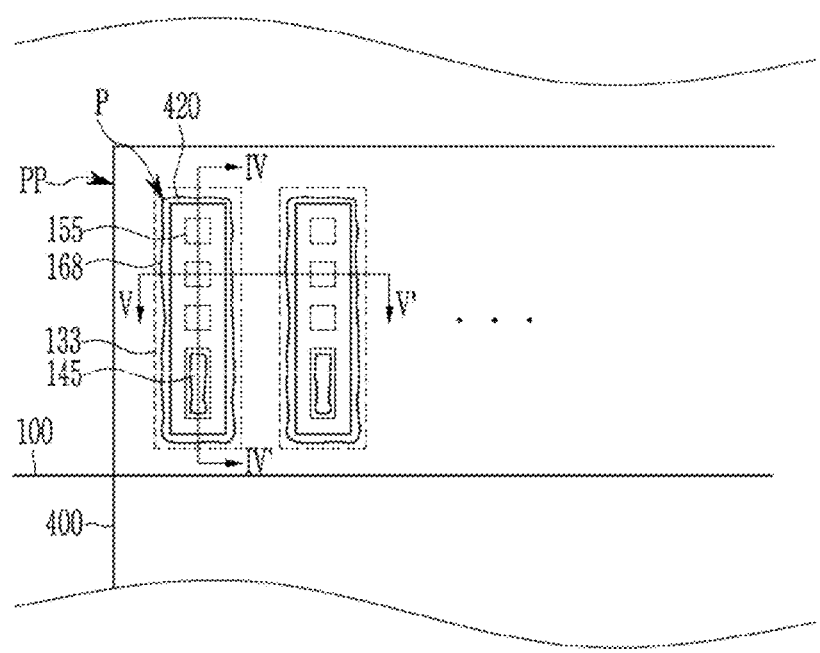
FIG. 3 schematically illustrates a pad portion of the display device shown in FIG. 1 according to an exemplary embodiment of the present invention.

FIG. 3 schematically illustrates a pad portion of the display device shown in FIG. 1. FIG. 4 schematic illustrates a cross-sectional view taken along line IV-IV' of FIG. 3. FIG. 5 illustrates a cross-sectional view taken along line V-V' of FIG. 3.

Figure 4:
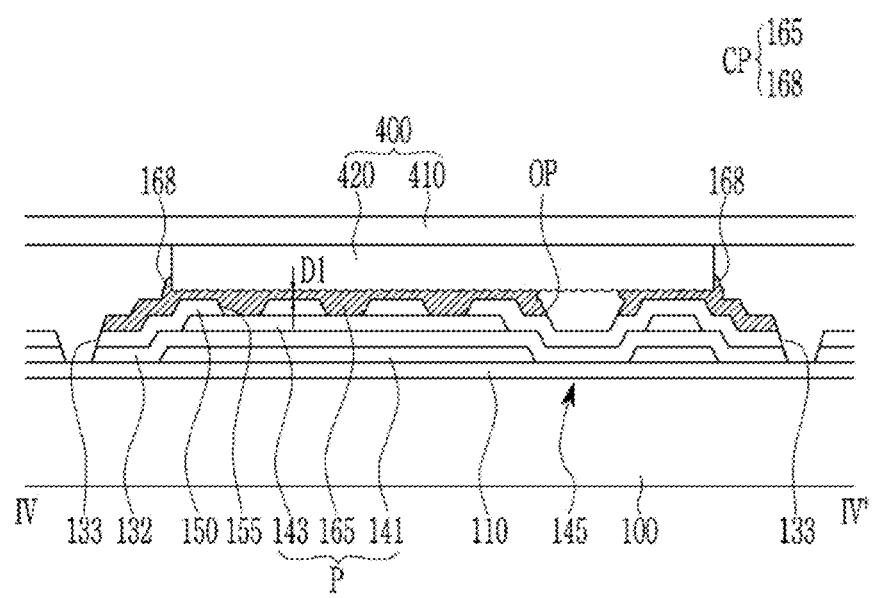
FIG. 4 schematic illustrates a cross-sectional view taken along line IV-IV' of FIG. 3 according to an exemplary embodiment of the present invention.
Figure 5:
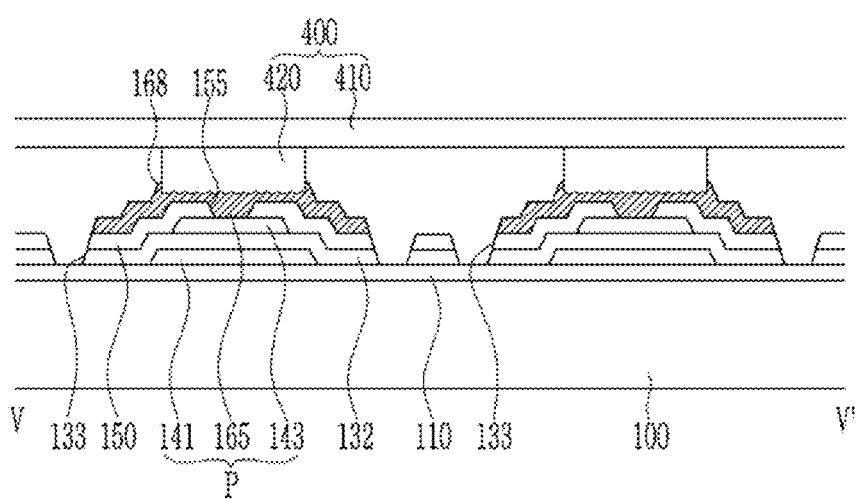
FIG. 5 illustrates a cross-sectional view taken along line V-V' of FIG. 3 according to an exemplary embodiment of the present invention.

Referring to FIG. 3 to FIG. 5, one end of the flexible printed circuit film 400 is bonded to the pad portion PP.

A plurality of pads P are spaced apart from each other by a predetermined interval in the pad portion PP. Each pad P has a substantially rectangular planar shape, and extends in a first direction perpendicular to an edge of the substrate 100 where the pad portion PP is disposed. For example, the one end of the flexible printed circuit film 400 is connected to the edge of the substrate 100. The flexible printed circuit film 400 includes a circuit film 410 and a plurality of leads 420 disposed on one surface of the circuit film 410. The plurality of leads 420 may correspond to the plurality of pads P. In an exemplary embodiment, each of the plurality of leads 420 may corresponds to a respective one of the plurality of pads P, and each of the plurality of leads 420 may be bonded to a corresponding one of the plurality of plurality of pads P in the pad portion PP.

Each pad P includes a gate pad electrode 141, a capacitor pad electrode 143, and a contact pad electrode 165. Hereinafter, in the description of the relationship between the pad portion PP and the display area DA, FIG. 1 and FIG. 2 may also be referred to.

The buffer layer 110 is disposed on the substrate 100, and the gate pad electrode 141 is disposed on the buffer layer 110. The gate pad electrode 141 may include the same material as the gate electrode 140 disposed in the display area DA. The gate pad electrode 141 and the gate electrode 140 may be simultaneously formed by the same process. The present invention is not limited thereto, and the gate pad electrode 141 and the gate electrode 140 may be separately formed by different processes. In addition, although not shown, the gate insulating layer 131 may be disposed between the gate pad electrode 141 and the buffer layer 110.

The capacitor insulating layer 132 is disposed on the gate pad electrode 141 and the buffer layer 110, and the capacitor pad electrode 143 is disposed on the capacitor insulating layer 132. Although not shown, the gate pad electrode 141 contacts the capacitor pad electrode 143 by a contact hole formed in the capacitor insulating layer 132 outside of the pad portion PP. The capacitor pad electrode 143 may include the same material as the second capacitor electrode C2 disposed in the display area DA. The capacitor pad electrode 143 may be formed by the same process as the second capacitor electrode C2. However, the present invention is not limited thereto, and the capacitor pad electrode 143 and the second capacitor electrode C2 may be separately formed by different processes.

The interlayer insulating layer 150 is disposed on the capacitor pad electrode 143 and the capacitor insulating layer 132. The interlayer insulating layer 150 includes a plurality of pad contact holes 155 overlapping the capacitor pad electrode 143. The plurality of pad contact holes 155 expose the capacitor pad electrode 143. In an exemplary embodiment, the capacitor pad electrode 143 is exposed by the plurality of pad contact holes 155. For the simplicity of description, the capacitor pad electrode 143 is exposed by four pad contact holes 155. The present invention, however, is not limited thereto, and the number of the plurality of pad contact holes 155 may be different from four. The plurality of pad contact holes 155 are spaced apart from each other by a predetermined distance in the first direction in which each of the pads P extend. In addition, a cutout 133 overlapping the buffer layer 110 is provided in the interlayer insulating layer 150 and the capacitor insulating layer 132. In an exemplary embodiment, the cutout 133 penetrates the interlayer insulating layer 150 and the capacitor insulating layer 132 to expose the buffer layer 110. The cutout 133 is disposed to surround each of the pads P.

The contact pad electrode 165 is disposed on the interlayer insulating layer 150 and the capacitor pad electrode 143. The contact pad electrode 165 contacts the capacitor pad electrode 143 and a corresponding lead of the leads 420, which may be referred to as the lead 420. The contact pad electrode 165 fills the pad contact holes 155, and contacts the capacitor pad electrode 143 through the pad contact holes 155. The contact pad electrode 165 is connected to a dummy electrode 168 that surrounds an edge of a lower surface of the lead 420. The contact pad electrode 165 and the dummy electrode 168 connected to each other may be referred to as a connection pad CP. Here, the lower surface of the lead 420 is a surface in contact with the contact pad electrode 165. The contact pad electrode 165 may include the same material as the source electrode 161 and the drain electrode 162 disposed in the display area DA, and the same material as the lead 420. Specifically, a portion of the contact pad electrode 165 contacting the lead 420 may include the same material as the source electrode 161 and the drain electrode 162, and the same material as the lead 420. The dummy electrode 168 may also include the same material as the source electrode 161 and the drain electrode 162, and the same material as the lead 420.

A lower surface of the lead 420 contacts the contact pad electrode 165. The lead 420 may include gold (Au) or silver (Ag), and the lower surface of the lead 420 has a protrusion-depression shape such as a bump. For example, the lower surface of the lead 420 may be uneven to increase a contact area between the lead 420 and the contact pad electrode 165. The lower surface of the lead 420 may partially include the same material as the source electrode 161 and the drain electrode 162.

Each pad P includes an inspection part 145. The inspection part 145 is an area in which the electrodes, that is, the gate pad electrode 141, the capacitor pad electrode 143, and the contact pad electrode 165, do not exist. For example, the inspection part 145 may be defined by an opening OP of the contact pad electrode 165. Under the opening OP, the interlayer insulating layer 150 and the capacitor insulating layer 132 are disposed and may be formed of an oxide material which allows light to pass therethrough. Thus, the lower surface of the lead 420 may be inspected through the inspection part 145 from the lower surface of the substrate 100.

When the flexible printed circuit film 400 is bonded to the pad portion PP, an ultrasonic bonding process is performed, and in this case, the surface irregularities such as a bump, discussed above, may be formed on the lower surface of the lead 420 by ultrasonic vibration. The lower surface of the lead 420 may be inspected through the inspection part 145, and the amount of roughness of the lower surface of the lead 420 may be inspected to determine a degree of bonding of the pad P and the lead 420. In an exemplary embodiment, as the amount of the roughness increases, the degree of the bonding increases.

Hereinafter, a manufacturing method of a display device according to an exemplary embodiment of the present invention will be described with reference to FIG. 6 to FIG. 8 and FIG. 4. In addition, in the description of the relationship between the pad portion PP and the display area DA, FIG. 1 and FIG. 2 may also be referred to.

Figure 6:
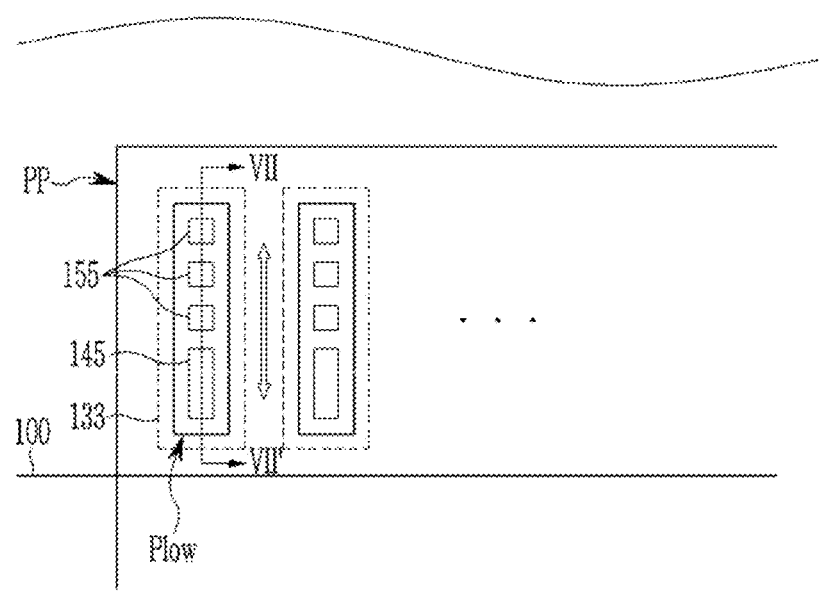
FIG. 6 to FIG. 8 schematically illustrate bonding processes for bonding a flexible printed circuit board to a pad portion according to an exemplary embodiment of the present invention.
Figure 7:
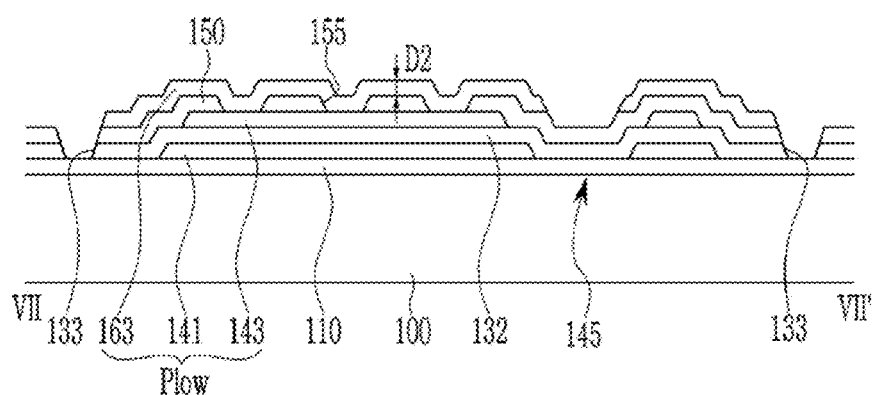
Figure 8:
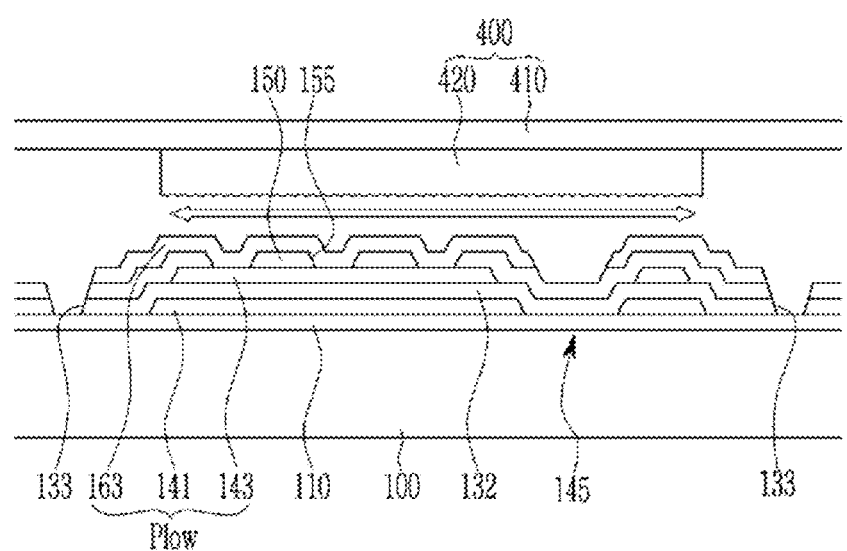

FIG. 6 to FIG. 8 schematically illustrate bonding processes for bonding a flexible printed circuit board to a pad portion according to an embodiment of the present invention.

Referring to FIG. 6 and FIG. 7, a plurality of spare pads Plow are formed on the substrate 100. The spare pads Plow are formed in the non-display area NA of the substrate 100. For example, the spare pad Plow may be formed in the pad portion PP. In this case, a plurality of pixels PX and wires are formed in the display area DA of the substrate 100.

The plurality of spare pads Plow are formed to be spaced apart from each other by a predetermined distance. Each spare pad Plow has a substantially rectangular planar shape, and extends in a first direction perpendicular to an edge of the substrate 100 where the pad portion PP is disposed. For example, the flexible printed circuit film 400 is connected to the edge of the substrate 100.

Each spare pad Plow includes the gate pad electrode 141, the capacitor pad electrode 143, and a data pad electrode 163. Only a structure of the data pad electrode 163 of the spare pad Plow according to the present embodiment is different from that of the pad P shown in FIG. 3 to FIG. 5, and the remaining structures are the same. Therefore, the description of the same structures will be omitted.

The data pad electrode 163 is disposed on the interlayer insulating layer 150, and contacts the capacitor pad electrode 143 through the pad contact holes 155. The data pad electrode 163 may include the same material as the source electrode 161 and the drain electrode 162 disposed in the display area DA.

Referring to FIG. 8 and FIG. 4, the flexible printed circuit film 400 is bonded to the pad portion PP after each lead 420 is associated with each spare pad Plow. For example, each lead 420 may be aligned with a corresponding spare pad Plow. When the flexible printed circuit film 400 is bonded to the pad portion PP, the ultrasonic bonding process is performed. While the ultrasonic bonding process is performed, a pressure such as an ultrasonic pressure wave is applied in a direction perpendicular to the upper surface of the substrate 100, and the performing of ultrasonic vibration proceeds in the first direction in which the spare pad Plow extends, as indicated with arrows in FIG. 8.

The data pad electrode 163 forms a step by the pad contact holes 155. In other words, the data pad electrode 163 and the interlayer insulating layer 150 form irregularities on the capacitor pad electrode 143. These irregularities are formed in an extending direction of the spare pad Plow to be able to increase frictional force between the lead 420 and the data pad electrode 163 in the ultrasonic bonding process.

As the data pad electrode 163 and the lead 420 rub against each other due to the ultrasonic bonding process, irregularities are formed on the lower surface of the lead 420, and a material of the lead 420 and a material of the data pad electrode 163 are mixed, and the mixture thereof contacts the lead 420 to form the contact pad electrode 165. That is, the pad P including the contact pad electrode 165 is formed. Therefore, the contact pad electrode 165 may include the same material as the source electrode 161 and the drain electrode 162 disposed in the display area DA and the same material as the lead 420.

Due to the ultrasonic bonding process, a thickness of the contact pad electrode 165 disposed on the interlayer insulating layer 150, that is, a thickness D1, as indicated in FIG. 4, between the upper surface of the interlayer insulating layer 150 and the upper surface of the contact pad electrode 165, may be smaller than a thickness of the data pad electrode 163 disposed on the interlayer insulating layer 150, that is, a thickness D2, as indicated in FIG. 7, between the upper surface of the interlayer insulating layer 150 and the upper surface of the data pad electrode 163. In addition, due to the ultrasonic bonding process, the irregularities of the data pad electrode 163 and the interlayer insulating layer 150 formed on the capacitor pad electrode 143 are eliminated, and the dummy electrode 168 surrounding the edge of the lower surface of the lead 420 may be formed.

After the ultrasonic bonding process, the lower surface of the lead 420 may be inspected through the inspection part 145. A degree of bonding between the pad P and the lead 420 may be determined by inspecting the roughness of the lower surface of the lead 420 through the inspection part 145 in the lower surface of the substrate 100.

When the flexible printed circuit film 400 is bonded using the conventional anisotropic conductive film, the bonding of the pad P and the lead 420 is performed by a conductive ball included in the anisotropic conductive film, so that the actual bonding area of the pad P and the lead 420 is smaller than the areas of the pad P and the lead 420.

When the pad P and the lead 420 are bonded by performing the ultrasonic bonding process while the flexible printed circuit film 400 is bonded as in the present embodiment, the lead 420 and the contact pad electrode 165, which are not conductive balls, are directly bonded, so that the bonding area of the pad P and the lead 420 may be increased. For example, the entire exposed surface of the capacitor pad electrode 143 by the pad contact holes 155 may be in contact with the lead 420.

Figure 9:
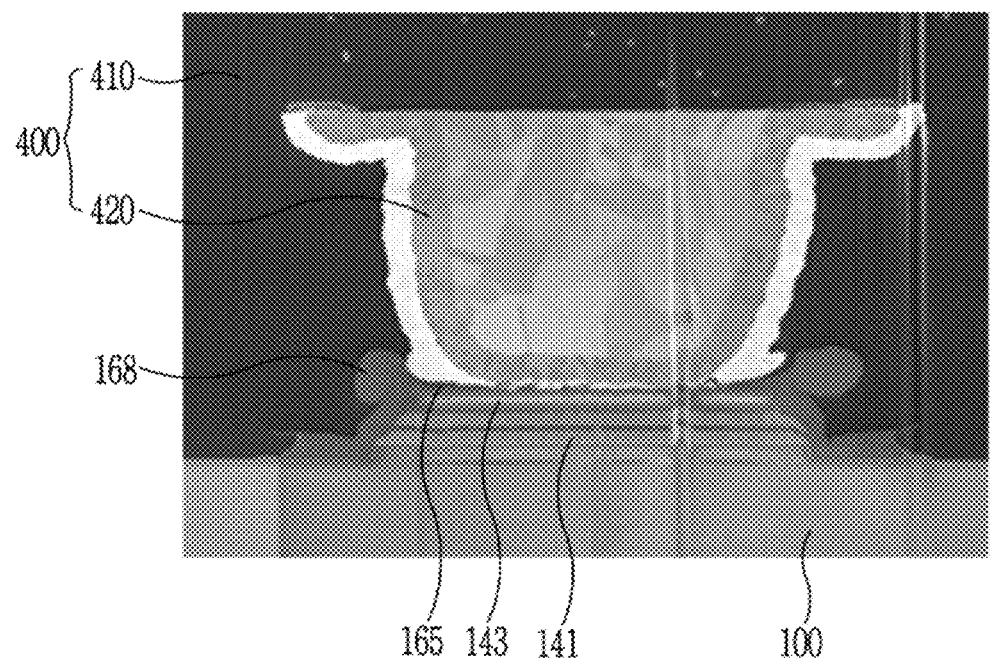
FIG. 9 and FIG. 10 illustrate cross-sectional scanning electron microscope (SEM) photographs of a pad portion in a bonding process for bonding a flexible printed circuit board to a pad portion according to an exemplary embodiment of the present invention.
Figure 10:
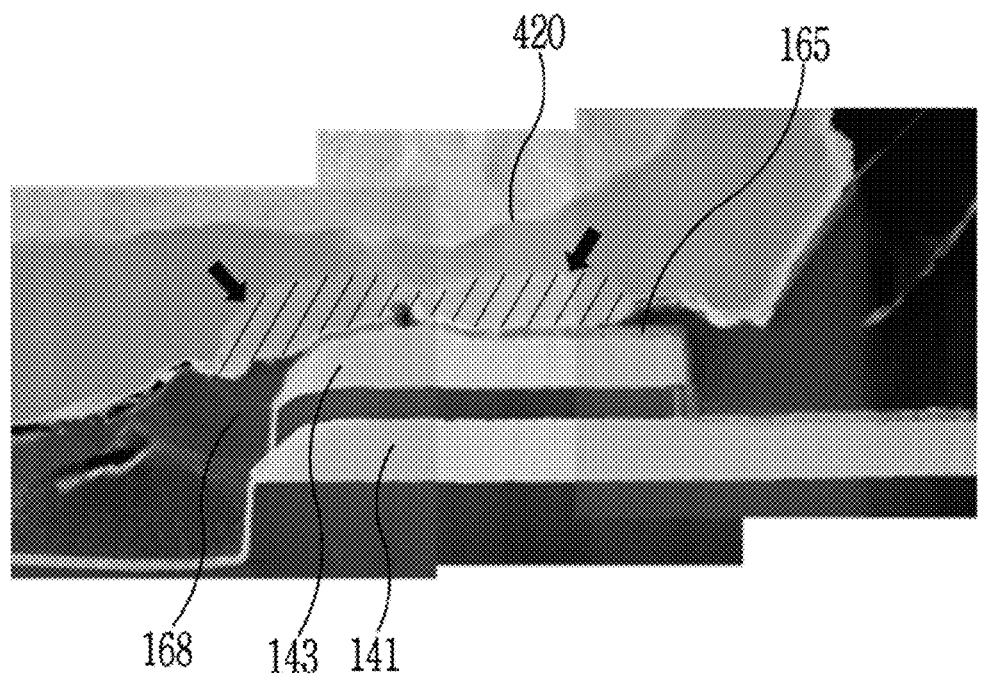

FIG. 9 and FIG. 10 illustrate cross-sectional scanning electron microscopy (SEM) photographs of a pad portion in a bonding process for bonding a flexible printed circuit board to a pad portion according to an exemplary embodiment of the present invention.

Referring to FIG. 9, the contact pad electrode 165 is connected to the dummy electrode 168 surrounding the edge of the lower surface of the lead 420 as described with reference to FIG. 4.

FIG. 10 illustrates a partially enlarged cross-sectional SEM photograph of a pad portion in a bonding process for bonding a flexible printed circuit board to a pad portion according to an embodiment of the present invention, and referring to FIG. 10, a portion indicated by the arrows of the contact pad electrode 165, which is disposed between the lead 420 and the capacitor pad electrode 143, is a portion including the same material as a material of the lead 420 and materials of the source electrode 161 and the drain electrode 162. That is, the portion of the contact pad electrode 165 contacting the lead 420 may include the same material as the source electrode 161 and the drain electrode 162, and the same material as the lead 420.

Figure 13:
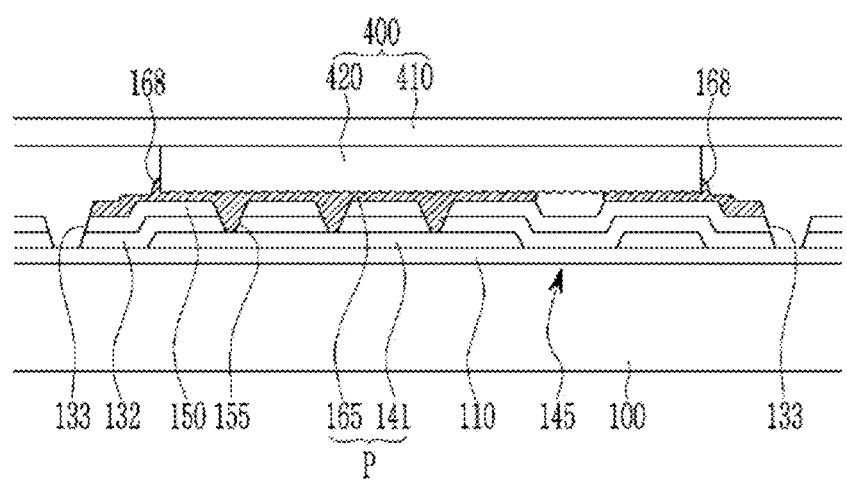
FIG. 13 schematically illustrates a cross-sectional view of a pad portion according to an exemplary embodiment of the present invention.
Figure 14:
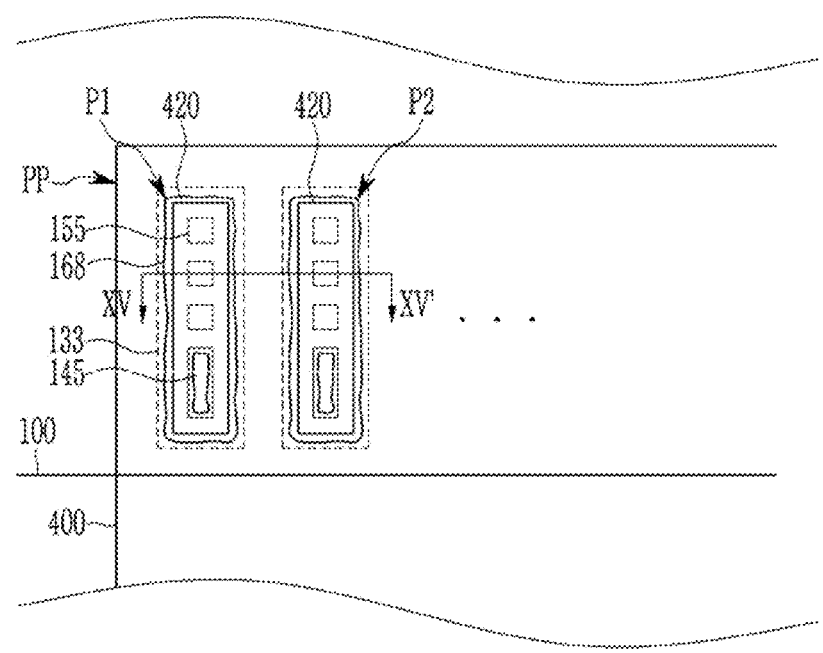
FIG. 14 schematically illustrates a cross-sectional view of a pad portion of a display device according to an exemplary embodiment of the present invention.
Figure 15:
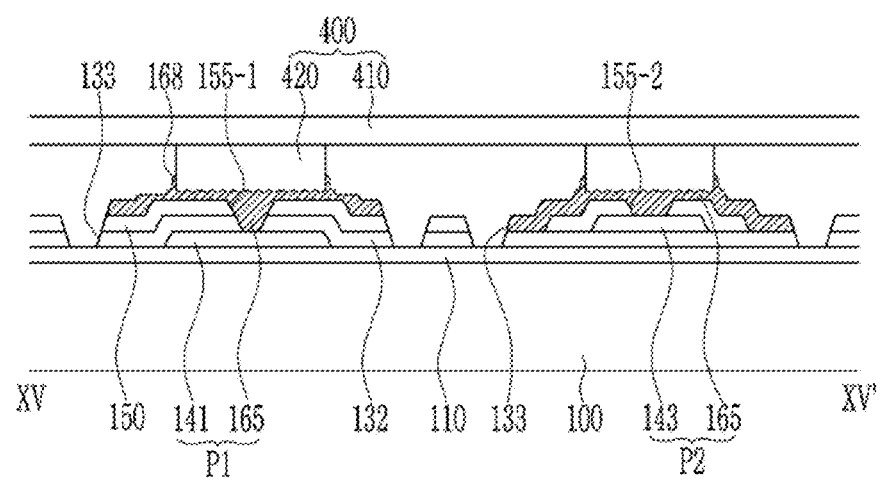
FIG. 15 illustrates a cross-sectional view taken along line XV-XV' of FIG. 14 according to an exemplary embodiment of the present invention.
Figure 16:
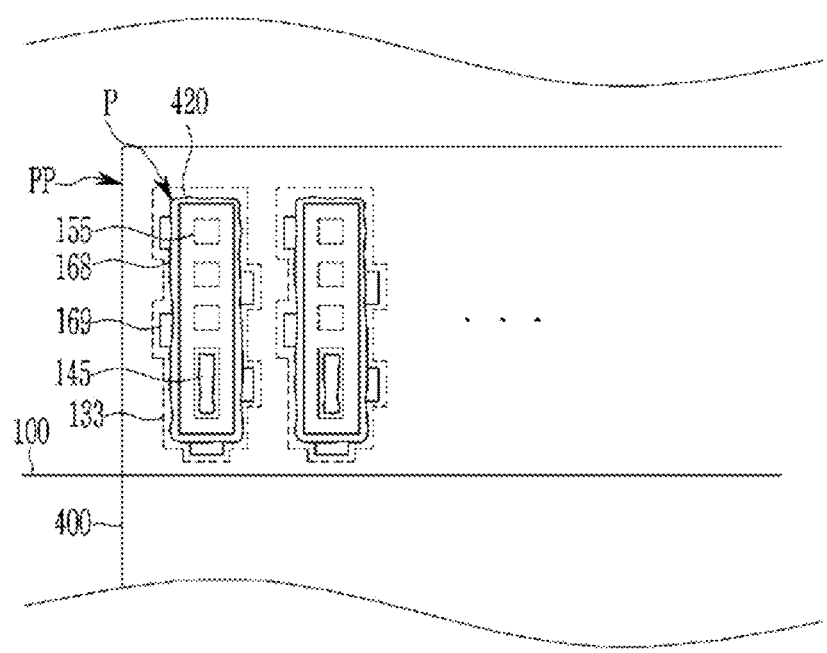
FIG. 16 schematically illustrates a pad portion of a display device according to an exemplary embodiment of the present invention.

Hereinafter, a pad portion according to an exemplary embodiment of the present invention will be described with reference to FIG. 11 to FIG. 16. Here, FIG. 11 and FIG. 12; FIG. 13, FIG. 14, and FIG. 15; and FIG. 16 show different embodiments.

Figure 11:
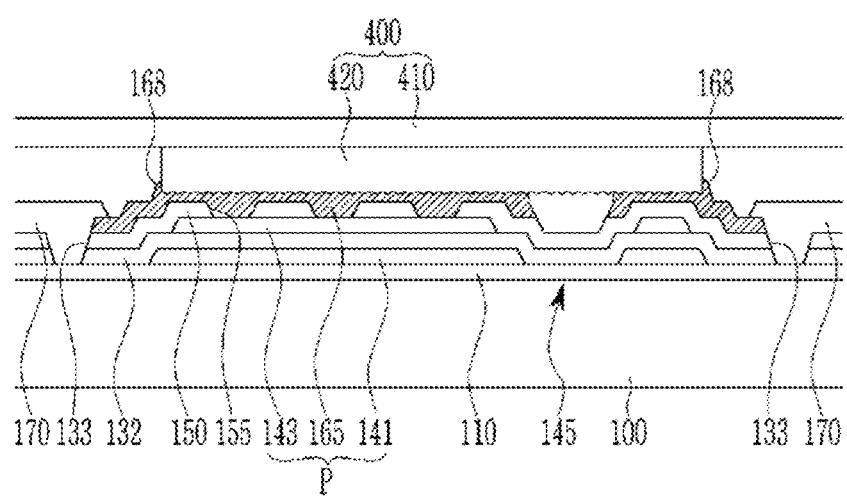
FIG. 11 and FIG. 12 schematically illustrate cross-sectional views of a pad portion according to an exemplary embodiment of the present invention.
Figure 12:
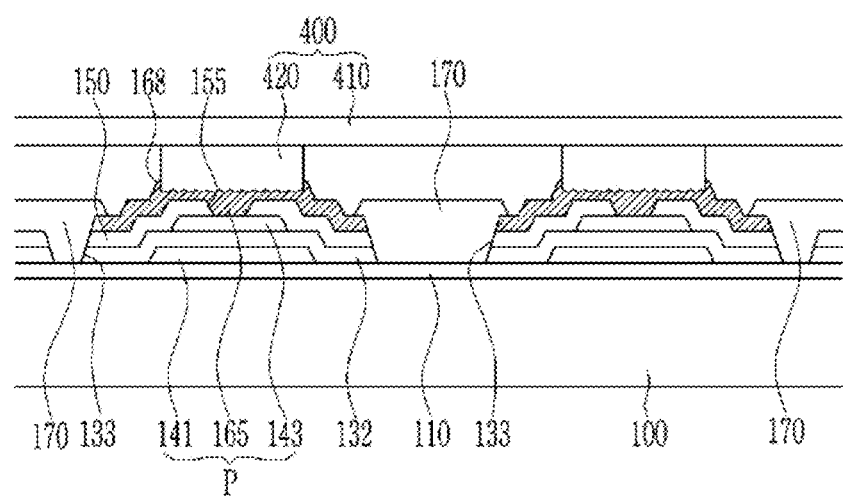

FIG. 11 and FIG. 12 schematically illustrate cross-sectional views of a pad portion according to an exemplary embodiment of the present invention. FIG. 11 schematically illustrates a cross-sectional view taken along an extending direction of the pad P as shown in FIG. 4, and FIG. 12 schematically illustrates a cross-sectional view of two adjacent pads P as shown in FIG. 5.

Referring to FIG. 11 and FIG. 12, only a structure of the planarization film 170 of the pad portion according to the present embodiment is different from that of the pad portion shown in FIG. 4 and FIG. 5, and the remaining structures are the same. The description of the same structures will be omitted.

The planarization film 170 covers the cutout 133 and covers a lateral surface of the contact pad electrode 165. When the flexible printed circuit film 400 is bonded to the pad portion PP, it is possible to prevent metal particles forming the electrode of each pad P and metal particles forming each lead 420 from being adhered to the contact pad electrode 165 by the planarization film 170, thereby prevent the adjacent pads P from being short-circuited.

FIG. 13 schematically illustrates a cross-sectional view of a pad portion according to an exemplary embodiment of the present invention. FIG. 13 schematically illustrates a cross-sectional view taken along the extending direction of the pad P, as shown in FIG. 4.

Referring to FIG. 13, only a structure of an electrode included in the pad portion according to the present embodiment is different from that of the pad portion shown in FIG. 4, and the remaining structures are the same. Therefore, the description of the same structures will be omitted.

Each pad P includes the gate pad electrode 141 and the contact pad electrode 165. That is, unlike the pad P shown in FIG. 4, the capacitor pad electrode 143 does not exist in the pad P according to the present embodiment. Thus, the pad contact holes 155 are disposed in the interlayer insulating layer 150 and the capacitor insulating layer 132, and overlaps the gate pad electrode 141. For example, the pad contact holes 155 penetrate the interlayer insulating layer 150 and the capacitor insulating layer 132 to expose the gate pad electrode 141. However, the present invention is not limited thereto, and the gate pad electrode 141 may be omitted from the exemplary embodiment of FIG. 4. That is, each pad P may include the capacitor pad electrode 143 and the contact pad electrode 165.

In addition, the planarization film 170 illustrated in FIG. 11 and FIG. 12 may be applied to the pad portion of the present exemplary embodiment of FIG. 13.

FIG. 14 schematically illustrates a cross-sectional view of a pad portion of a display device according to an exemplary embodiment of the present invention. FIG. 15 illustrates a cross-sectional view taken along line XV-XV' of FIG. 14.

Referring to FIG. 14 and FIG. 15, structures of electrodes included in pads adjacent to each other are different. That is, only the structure of the electrode included in the pad portion according to the present embodiment is different from that of the pad portion shown in FIG. 3 to FIG. 5, and the remaining structures are the same. Therefore, the description of the same structures will be omitted.

A first pad P1 and a second pad P2 of the pad portion PP are spaced apart from each other by a predetermined distance. A structure of an electrode included in the first pad P1 and a structure of an electrode included in the second pad P2 are different from each other. The first pad P1 includes the gate pad electrode 141 and the contact pad electrode 165, and the second pad P2 includes the capacitor pad electrode 143 and the contact pad electrode 165.

Unlike the pad P shown in FIG. 3 to FIG. 5, there is no capacitor pad electrode 143 in the first pad P1. Thus, a first pad contact hole 155-1 is disposed in the interlayer insulating layer 150 and the capacitor insulating layer 132, and overlaps the gate pad electrode 141. For example, the first pad contact hole 155-1 penetrates the interlayer insulating layer 150 and the capacitor insulating layer 132 to expose the gate pad electrode 141. Unlike the pad P shown in FIG. 3 to FIG. 5, there is no gate pad electrode 141 in the second pad P2. Thus, a second pad contact hole 155-2 is disposed in the interlayer insulating layer 150 and overlaps the capacitor pad electrode 143. For example, the second pad contact hole 155-2 penetrates the interlayer insulating layer 150 to expose the capacitor pad electrode 143.

In addition, the planarization film 170 illustrated in FIG. 11 and FIG. 12 may be applied to the pad portion of the present embodiment of FIG. 15.

FIG. 16 schematically illustrates a pad portion of a display device according to an exemplary embodiment of the present invention.

Referring to FIG. 16, only the structure of the contact pad electrode of the pad portion according to the present embodiment is different from that of the pad portion shown in FIG. 3 to FIG. 5, and the remaining structures are the same. Therefore, the description of the same structures will be omitted.

The contact pad electrode 165 includes a plurality of protrusions 169 protruding from the contact pad electrode 165 in a plan view. The protrusion 169 protrudes to left, right, and lower sides of the contact pad electrode 165 in a plan view. An imaginary center line passing through a center of the protrusion 169 disposed at the left side of the contact pad electrode 165 in a plan view does not meet an imaginary center line passing through a center of the protrusion 169 disposed at the right side of the contact pad electrode 165 in a plan view.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a substrate including a pad portion with a plurality of pads spaced apart from each other by a predetermined distance;
    a flexible printed circuit board with a plurality of leads;
    a semiconductor layer disposed on the substrate;
    a gate insulating layer disposed on the semiconductor layer;
    a gate electrode and a first capacitor electrode disposed on the gate insulating layer and spaced apart from each other;
    a capacitor insulating layer disposed on the gate electrode and the first capacitor electrode;
    a second capacitor electrode disposed on the capacitor insulating layer and overlapping the first capacitor electrode;
    an interlayer insulating layer disposed on the capacitor insulating layer and the second capacitor electrode;
    a source electrode and a drain electrode disposed on the interlayer insulating layer and spaced apart from each other;
    a planarization film disposed on the source electrode and the drain electrode; and
    a light emitting diode disposed on the planarization film and connected to the drain electrode,
    wherein each of the plurality of pads is bonded to a corresponding lead of the plurality of leads, each of the plurality of pads includes a contact pad electrode that contacts a lower surface of the corresponding lead of the plurality of leads, and a dummy electrode surrounding a lower portion of the corresponding lead of the plurality of leads,
    wherein the dummy electrode is directly connected to the contact pad electrode.

2. The display device of claim 1, wherein
    the contact pad electrode includes the same material as the plurality of leads.

3. The display device of claim 2, wherein
    the lower surface of each of the plurality of leads is uneven.

4. The display device of claim 3, wherein
    each of the plurality of pads further includes an inspection part configured to inspect the lower surface of the corresponding lead of the plurality of leads, and
    wherein an opening of the contact pad electrode corresponds to the inspection part.

5. The display device of claim 4, wherein
    each of the plurality of pads extends in a first direction perpendicular to an edge portion of the substrate on which the flexible printed circuit board is connected to the pad portion.

6. The display device of claim 1, further comprising:
    a cutout surrounding each of the plurality of pads,
    wherein the cutout penetrates the interlayer insulating layer and the capacitor insulating layer.

7. The display device of claim 6, wherein
    the planarization film covers the cutout and covers a lateral surface of the contact pad electrode.

8. The display device of claim 7, wherein
    each of the plurality of pads further includes a gate pad electrode disposed between the substrate and the contact pad electrode.

9. The display device of claim 8, further comprising:
    a plurality of pad contact holes penetrating the interlayer insulating layer and the capacitor insulating layer to expose the gate pad electrode and spaced apart from each other in the first direction,
    wherein the capacitor insulating layer and the interlayer insulating layer are disposed between the gate pad electrode and the contact pad electrode, and
    the contact pad electrode contacts the gate pad electrode through the plurality of pad contact holes.

10. The display device of claim 8, wherein
    each of the plurality of pads further includes a capacitor pad electrode between the gate pad electrode and the contact pad electrode,
    the gate pad electrode includes the same material as the gate electrode,
    the capacitor pad electrode includes the same material as the second capacitor electrode, and the contact pad electrode includes the same material as the source electrode and the drain electrode.

11. The display device of claim 10, further comprising:
a plurality of pad contact holes penetrating the interlayer insulating layer to expose the capacitor pad electrode and spaced apart from each other in the first direction,
wherein the capacitor insulating layer is disposed between the gate pad electrode and the capacitor pad electrode,
the interlayer insulating layer is disposed between the capacitor pad electrode and the contact pad electrode, and
the contact pad electrode contacts the capacitor pad electrode through the plurality of pad contact holes.

12. The display device of claim 7, wherein
the plurality of pads include a first pad and a second pad adjacent to each other,
the first pad further includes a gate pad electrode disposed between the substrate and the contact pad electrode, and
the second pad further includes a capacitor pad electrode disposed between the substrate and the contact pad electrode.

13. The display device of claim 7, wherein
the contact pad electrode further includes a plurality of protrusions disposed on left, right, and lower sides of the contact pad electrode in a plan view.

* * * * *